(12) United States Patent
Dempsey et al.

(10) Patent No.: US 7,136,002 B2
(45) Date of Patent: Nov. 14, 2006

(54) DIGITAL TO ANALOG CONVERTER

(75) Inventors: Dennis A. Dempsey, Limerick (IE); Thomas G. O'Dwyer, Clare (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/107,094

(22) Filed: Apr. 15, 2005

(65) Prior Publication Data

US 2006/0232459 A1    Oct. 19, 2006

(51) Int. Cl.
    *H03M 1/66* (2006.01)
(52) U.S. Cl. ........................ 341/145; 341/144
(58) Field of Classification Search ............... 341/145, 341/154
    See application file for complete search history.

(56) References Cited

U.S. PATENT DOCUMENTS 3,997,892 A    12/1976    Susset
4,338,591 A  *  7/1982    Tuthill .................. 341/145
4,543,560 A  *  9/1985    Holloway ............... 341/133
5,495,245 A  *  2/1996    Ashe ..................... 341/145
5,969,657 A  * 10/1999    Dempsey et al. .......... 341/145

* cited by examiner

*Primary Examiner*—Rexford Barnie
*Assistant Examiner*—Joseph Lauture
(74) *Attorney, Agent, or Firm*—Gauthier & Connors LLP

(57) ABSTRACT

The present invention provides an improved Digital to Analog Converter (DAC) of the switched dual string DAC type, which saves on chip surface area, reduces the number of resistors and implementation cost, reduces the self capacitance and the device leakage currents of the circuit elements. The invention provides a guaranteed monotonic DAC architecture, which comprises a switching network for creating three states at a DAC transition node. In one embodiment the invention provides an unloaded state wherein a LSB DAC is de-coupled from a MSB DAC wherein the node between neighboring MSB DAC resistors is coupled to the DAC output. One of the advantages of creating the unloaded state is that the number of LSB DAC resistors is reduced as is normally the case in the prior art for a similar application.

18 Claims, 8 Drawing Sheets

| CODE | SM SWITCHES ON | F OR D SWITCH ON |
| --- | --- | --- |
| 0 | N/A | F0 |
| 1 | SM0 + SM1 | D0 |
| 2 | SM0 + SM1 | D1 |
| 3 | SM0 + SM1 | D2 |
| 4 | N/A | F1 |
| 5 | SM1 + SM2 | D2 |
| 6 | SM1 + SM2 | D1 |
| 7 | SM1 + SM2 | D0 |
| 8 | N/A | F2 |
| 9 | SM2 + SM3 | D0 |
| 10 | SM2 + SM3 | D1 |
| 11 | SM2 + SM3 | D2 |
| 12 | N/A | F3 |
| 13 | SM3 + SM4 | D2 |
| 14 | SM3 + SM4 | D1 |
| 15 | SM3 + SM4 | D0 |
| 16 | N/A | F4 |

Switching of FIG. 5B

FIG. 6A

| CODE | SM SWITCHES ON | D SWITCHES ON |
|---|---|---|
| 0 | SM0 | DX |
| 1 | SM0 + SM1 | D0 |
| 2 | SM0 + SM1 | D1 |
| 3 | SM0 + SM1 | D2 |
| 4 | SM1 | DX |
| 5 | SM1 + SM2 | D2 |
| 6 | SM1 + SM2 | D1 |
| 7 | SM1 + SM2 | D0 |
| 8 | SM2 | DX |
| 9 | SM2 + SM3 | D0 |
| 10 | SM2 + SM3 | D1 |
| 11 | SM2 + SM3 | D2 |
| 12 | SM3 | DX |
| 13 | SM3 + SM4 | D2 |
| 14 | SM3 + SM4 | D1 |
| 15 | SM3 + SM4 | D0 |
| 16 | SM4 | DX |

Switching of FIG. 5C

FIG. 6B

Case $N_2 = 1$

Case $N_2 = 2$

DIGITAL TO ANALOG CONVERTER

FIELD OF THE INVENTION

This invention relates generally to digital to analog converters (DACs) and more particularly to guaranteed monotonic, switched dual-string type DACs adapted to reduce and improve the design requirements for integrated circuit fabrication. The invention also relates to a switched dual-string DAC implemented using MOS switches or other types of switching technologies.

BACKGROUND TO THE INVENTION

As is known in the art, DACs have been used in a wide variety of applications to convert an N-bit digital word into a corresponding analog signal. One such DAC includes a string of $2^N$ resistors having substantially the same resistance serially connected across a reference voltage. Thus, the resistor string divides the reference voltage among the resistors in the string. A switching network is provided for coupling the voltage at one of the resistors to an output to produce the converted voltage. While such a DAC is suitable for applications where N is relatively small, when N is large, for example, where N is in the order of twelve, 4,096 resistors, 4,096 switches, and 4,096 control lines are required thereby resulting in a relatively large number of elements to be fabricated on an integrated circuit chip.

One technique suggested to reduce the number of elements is to use a segmented converter. In a segmented converter, a first stage uses a resistor string for converting a group of higher order bits of the N-bit digital word and a second stage decodes the remaining, lower order bits. A non-linear converter of that general type is shown in an article by Gryzbowski et al., entitled "Non-liner Functions from D/A Converters", Electronic Engineering 1971, pgs. 48–51. The converter disclosed in that article is designed for operation with relay switching and is not readily adapted to modern semiconductor technology. Another segmented converter is described in U.S. Pat. No. 3,997,892, issued December 1976, inventor Susset. The segmented converter described in U.S. Pat. No. 4,543,560 includes a resistor string for both the first and second stages with buffer amplifiers between the stages to prevent the second stage resistor string from loading the first resistor string.

Another type of segmented DAC is described in U.S. Pat. No. 5,495,245, issued Feb. 27, 1996, inventor James J. Ashe, assigned to the same assignee as the present invention. The DAC described therein includes a pair of first stage resistor strings coupled to a second resistor string through a first switching network. A pair of reference voltages are coupled to the pair of resistor strings. The first switching network operates such that a voltage produced at a selected one of the resistors in one of the pair of first stage resistor strings and a voltage produced at a selected one of the resistors in the other one of the pair of first resistor strings are coupled across the second stage resistor string. A second switching network couples an output at a selected one of the resistors in the second resistor string to an output of the DAC. Buffer amplifiers are not included between the pair of first stage resistor strings and the second stage resistor string. Two arrangements are described. In one arrangement, the first switching network responds to the Most Significant Bits (MSBs) and the second switching network responds to the Least Significant Bits (LSBs). In the other arrangement, the first switching network responds to the LSBs and the second switching network responds to the MSBs. In former arrangement, each resistor in the pair of resistor strings has a value $2^N*R$, where R is the resistance of each of the $2^{N/2}$ resistors in the second resistor string. In the latter arrangement, each resistor in the second resistor string has a value $2^{N/2}*R$, where R is the resistance of each resistor in the pair of first resistor strings. In both arrangements, the entire current passing between the pair of reference voltages passes through the resistors. Therefore, while such arrangements are useful in many applications the relatively high number of resistors which are required in both the first and second pairs of resistor strings thereby requiring relative large chip surface area for their fabrication.

Another problem with these type of DACs is that low 'on' impedance requires large switches that have large unwanted parasitic capacitance due to the relatively large area of the switches. This capacitance results in slowing down the switching transient operation of the converter and limits higher speed performance. Minimum sized switches are therefore desirable to minimise the capacitance. A further problem with large, low 'on' impedance switches is that they have proportionally higher device leakage currents. Diode leakage and MOS 'off leakage' are an unwanted error component in string DAC's. The leakage components are also highly temperature dependent and these leakage currents can limit the maximum operating range of an Integrated Circuit (IC). Minimum sized switches are therefore desirable to minimise device leakage effects.

A further type of DAC is described in U.S. Pat. No. 5,969,657 issued Feb. 19, 1999, inventor Dennis Dempsey et al, assigned to the same assignee as the present invention and incorporated herein by reference. Referring to prior art FIGS. 1 and 2, a DAC 10 is shown to adapted to convert an N bit, here N=4, digital word, I4 I3 I2 I1, (where bit I1 is the least significant bit (LSB) and I4 is the most significant bit (MSB)) into a corresponding analog signal, Vo, at output terminal 11. The DAC 10 includes a pair of resistor strings 12, 14. Resistor string 12 is adapted for coupling across a voltage supply 15. The voltage supply 15 produces a voltage, +V, at terminal 16 relative to ground potential at terminal 18. The first resistor string has a plurality of, here $2^{N/2}$, (i.e., 4) resistors Ra1–Ra4, serially connected between terminals 16 and 18, as shown. The resistance of each one of the resistors Ra1–Ra4 is here R1 ohms. It is noted that resistors Ra1, Ra2, Ra3 and Ra4 have: resistor Ra1 terminals T0, T1; resistor Ra2 terminal T1, T2; resistor Ra3 terminals T2 and T3; and, resistor Ra4 terminals T3 and T4, respectively, as shown. Resistor Ra4 terminal T4 is connected to terminal 16 and resistor Ra1 terminal T0 is connected to input terminal 18, as shown. The resistors Ra1–Ra4 in the resistor string 12 produce voltages at the terminals T1–T3 in response to current fed thereto from the voltage supply 15.

The second resistor string 14 has a plurality of, only $2^{N/2}-1$, here three resistors Rb1, Rb2, and Rb3 of substantially equal resistance, have a resistance of R2 ohms, serially coupled between a pair of second resistor string 14 input terminals 26, 28, as shown. It is noted that $2^{N/2}-1$ is an odd integer. Resistors Rb1, Rb2 and Rb3 have: resistor Rb1 terminals Q1, Q2, resistor Rb2 has resistor terminals Q2, Q3, and resistor Rb3 has resistor terminals Q3, Q4, respectively, as shown. Terminal Q1 is connected to input terminal 28 and terminal Q4 is connected to input terminal 26.

The DAC disclosed by U.S. Pat. No. 5,969,657 integrates the MSB switch impedance into the transfer function such that the MSB switch impedance causes a step in the transfer function of one LSB when the LSB DAC switches between neighbouring MSB resistors. The impedance of the MSB switches is proportional to the DAC resistors, thereby requiring a larger area for each switch for applications which require reasonably low impedance switches. A requirement for low impedance switches can increase the IC surface area and cost of a circuit, which is undesirable and restricts the design of the DAC. Additionally a problem with large low impedance switches is that due to the larger surface area the self capacitance of the switch increases which slows down the speed of the DAC and diode leakage which sets a lower power operation limit. Switch capacitance is also a particular problem for high speed DAC's which are implemented using MOS design or other similar switch design techniques.

There is therefore a need to provide a Digital to Analog Converter which saves on chip surface area, reduces the number of resistors and implementation cost, reduces the self capacitance and the device leakage currents of the circuit elements. A further need is to increase the DAC transition speed and improve the overall performance of the converter. Another need in the field of Digital to Analog Converters is to increase the accuracy of a dual string digital to analog converter by reducing the number of device leakage components. A further need is to increase the operation temperature range for the switching devices in a switched dual string digital to analog converter.

SUMMARY OF THE INVENTION

In accordance with the present invention there is provided an improved Digital to Analog Converter (DAC) of the switched dual string DAC type, which saves on chip surface area, reduces the number of resistors and implementation cost, reduces the self capacitance and the device leakage currents of the circuit elements. The invention provides a guaranteed monotonic DAC architecture, which comprises a switching network for creating three states at a DAC transition node, as set out in the appended claims. In addition to the two states provided during switching of a dual string DAC as described in U.S. Pat. No. 5,969,657 the invention provides a substantially unloaded state wherein a LSB DAC is de-coupled from a MSB DAC wherein the node between neighbouring MSB DAC resistors is coupled to the DAC output. This has the advantage that the number of LSB DAC resistors is reduced as is normally the case in the prior art for a similar application.

The invention provides an unloaded state of the MSB DAC by cutting the current path from the MSB DAC resistor through the LSB DAC resistor. No conduction path exists in either variant for the new unloaded state from a terminal of a first MSB DAC resistor to a second terminal of a resistor in the MSB DAC through the LSB DAC in this unloaded state. The unloaded state can be considered to be a substantially unloaded state or a substantially non-conducting LSB DAC state.

For a sub-DAC requiring $2^{N/2}$ codes, the number of resistors required by this new DAC is reduced to $2^{N/2}-2$, comparing to $2^{N/2}-1$ for the DAC of U.S. Pat. No. 5,969,657 as discussed above in detail. Furthermore, the number of LSB DAC switches is reduced to $2^{N/2}-1$, in comparison to $2^{N/2}$ switches in the DAC of U.S. Pat. No. 5,969,657.

The present invention divides the LSB transition action into two parts, creating a new, unloaded state wherein the node between neighbouring MSB DAC resistors is coupled directly to the DAC output while the LSB DAC is de-coupled from the MSB DAC. This comparative division in two requires the switches to have correspondingly double the impedance to create one LSB step. This is advantageous as it allows for the reduction in switch sizes.

According to one aspect of the invention there is provided a digital to analog converter (DAC), comprising a pair of resistor strings, a first one of the resistor strings being adapted for coupling across a voltage supply, resistors in the first resistor string producing voltages in response to current fed thereto from the voltage supply and a second one of the resistor strings; a switching network adapted to couple a voltage produced across a selected one of resistors in the first string across the second one of the resistor strings in response to a digital input signal, the resistors in the second resistor string producing voltages in response to current passing from the first resistor string through the second resistor string through said switching network to produce a corresponding analog signal to said digital input signal to an output; and wherein an unloaded state is generated when a Least Significant Bit (LSB) of said DAC, associated with said first resistor string, is de-coupled from a Most Significant Bit (MSB) resistor of said DAC, associated with said second resistor string, of said digital input signal by said switching network.

According to another aspect of the invention there is provided a digital to analog converter, comprising a resistor string with a plurality of resistors; a switching network adapted to couple a voltage produced across a selected one of the resistors in said resistor string to an output node in response to a digital input signal, said digital signal comprising a digital bit stream, to produce a corresponding analog signal to said digital input signal at said output node, wherein the switching network is adapted to provide a substantially unloaded state for coupling the voltage to the output node.

According to a further aspect of the invention there is provided a digital to analog converter, comprising a resistor string; a switching element adapted to couple a voltage produced at a terminal of a selected resistor of said resistor string to an output node in response to a digital input signal, said signal comprising a digital bit stream to produce a corresponding analog signal to said digital input signal at said output node, wherein an unloaded state is provided for coupling the voltage to the output node at substantially no load condition.

Furthermore the MSB DAC switch impedance requirements of the converter are reduced as the DAC MSB switches impedance of the present invention is substantially twice the impedance of the MSB switches in prior art converters because of the coupling of the node between neighbouring MSB DAC resistors to the DAC output.

Ideally the MSB Switches are sized such that the two states on either side of this correspond to one LSB steps.

Preferably the MSB switches of the present invention are substantially one half the size of existing prior art switches to achieve the same impedance effect. Consequently it will be appreciated that the switches of the present invention take up less circuit area.

MOS switches have parasitic diode leakage current, which increases exponentially with temperature, and thus can limit the useful temperature range in low leakage applications. The lower circuit area of the MOS switches results in correspondingly smaller diode leakage and thus the MOS switches in DACs using invention can operate at higher temperature.

Additional MSB switches may be used to couple the MSB DAC node directly whereby substantially no load is placed in parallel with an MSB resistor in the new unloaded state. Alternatively a series coupled MSB switch and LSB switch can be used where only one of two MSB switches is de-coupled from the MSB DAC and the MSB and LSB switches corresponding to the MSB DAC node required are enabled.

BRIEF DESCRIPTION OF THE DRAWINGS

Other features of the invention, as well as the invention itself, will become more readily apparent with reference to the following detailed description taken together with the following drawings, in which:

FIG. 6A and FIG. 6B are tables showing the relationship between the four bit digital words fed to the DAC of FIG. 5B and FIG. 5C respectively and open/closed positions of switches used in such a DAC;

DETAILED DESCRIPTION OF THE DRAWINGS

Figure 2:
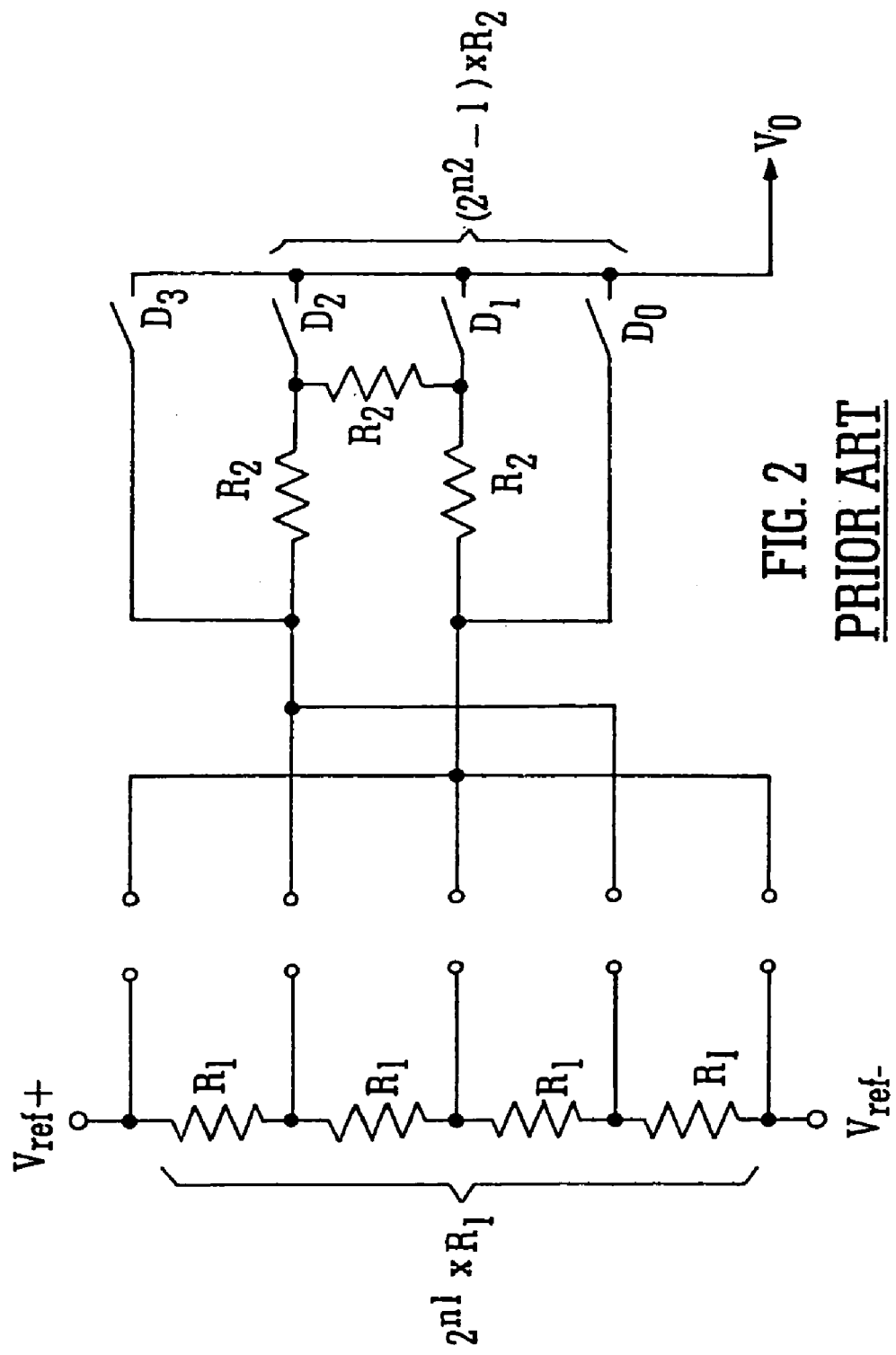
FIG. 2 is a schematic diagram of another prior art DAC structure having a pair of resistor strings.

Referring initially to FIGS. 2 and 3 illustrate a prior art implementation of the decoding of the digital signals or digital words. In FIG. 2 on the left hand side of the circuit a first resistor string decodes the MSB of said digital signal using a switching network coupled to a second resistor string which decodes the LSB of said digital signal which provide an output analog signal, the operation of which is described in the aforementioned U.S. Pat. No. 5,969,657. The DAC described in U.S. Pat. No. 5,969,657 integrates the MSB impedance and sub-DAC loading effect into the DAC transfer function such that when the LSB DAC moved from coupling across a MSB resistor, R1 to a neighbouring MSB resistor, R2 so that the outpur change corresponds to substantially one LSB.

Figure 1:
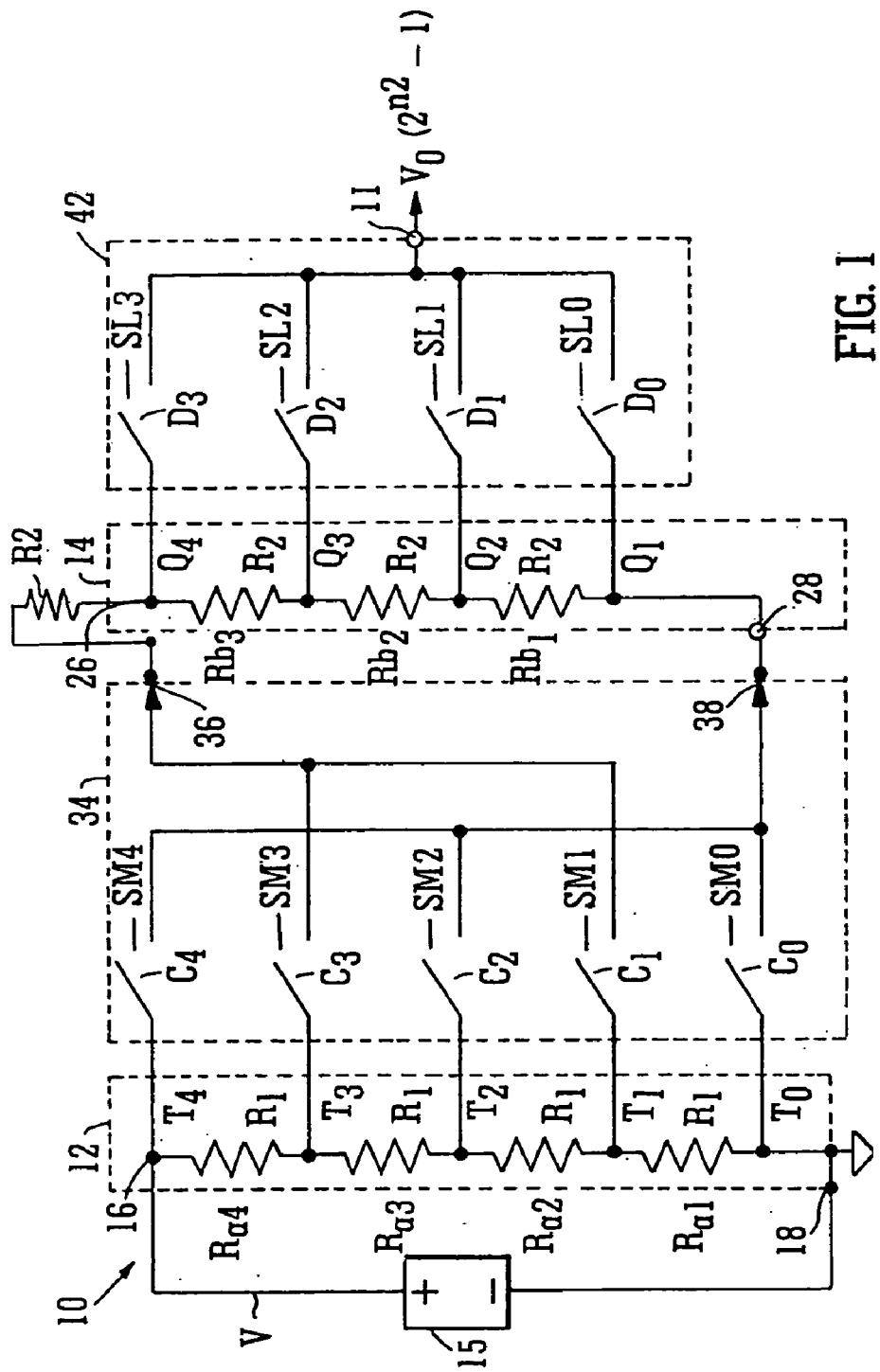
FIG. 1 is a schematic diagram of a prior art four bit digital to analog converter (DAC) having a pair of resistor strings.
Figure 3A:
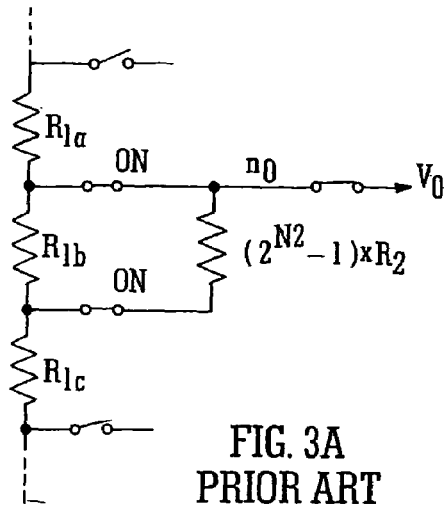
FIGS. 3(a) & (b) illustrates a voltage shift to move the LSB DAC loading node of a prior art implementation.
Figure 3B:
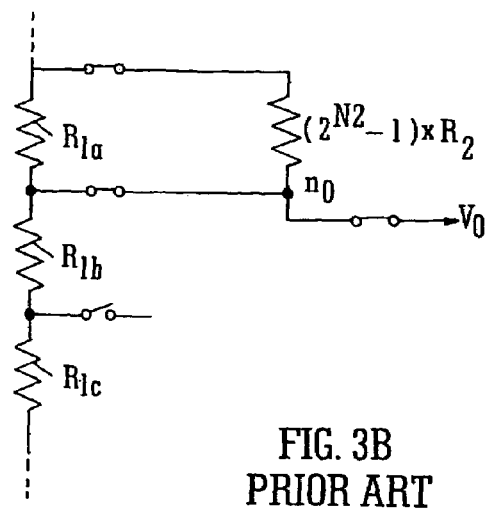

FIGS. 3(a) and (b) illustrates a typical voltage shift between two states at node N1 shown in FIG. 1. In FIG. 3(a) the voltage at node N1 is influenced due to the loading effect of the LSB DAC and the MSB switch impedance. An MSB DC resistor change illustrated in FIG. 3(b) causes the loading effect to be inverted by substantially the same amount. For all digital input levels, the LSB DAC current flows through an "on" MSB switch causing an $I_{LSB}*R_{ON}$ voltage drop, ideally equal to one half of an LSB. After an MSB DAC transition the voltage drop is of the opposite polarity, again ideally one half of an LSB. Hence, the loading effect of the sub-DAC creates a one LSB step at the MSB DAC transition.

Figure 4:
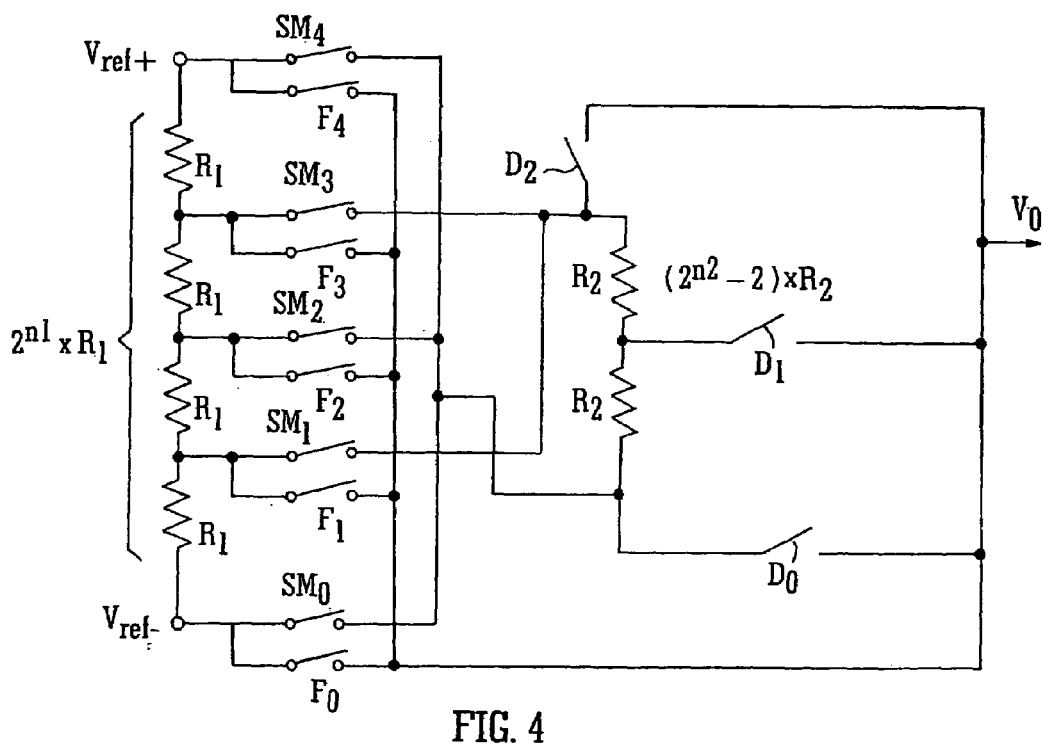
FIG. 4 is a schematic diagram of a DAC according to the present invention.

Referring now to FIG. 4 illustrates a schematic of a dual string DAC according to the present invention illustrated generally by the reference numeral 20. The invention creates a new unloaded state where the DAC loading effect is substantially removed at a unloaded MSB state. The effect of this new unloaded state is that is substantially divides the normal MSB switch impedance requirements, as illustrated in U.S. Pat. No. 5,969,657, by two.

FIGS. 5 (a), (b), (c) and (d) illustrates the switching operation of nodes according to the invention. The LSB DAC is coupled across R1b, a first MSB DAC resistor, in a first state in FIGS. 5(a) and in a subsequent DAC state the LSB DAC couples across R1a, a neighbouring MSB DAC resistor shown in FIG. 5(d).

Figure 5A:
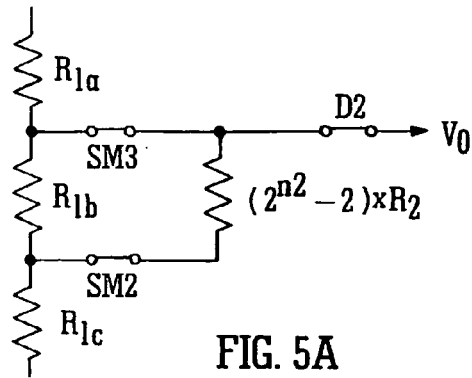
FIGS. 5(a), (b), (c) & (d) illustrates when the LSB DAC in two variants of an unloaded state according to two different embodiments of the invention.
Figure 5B:
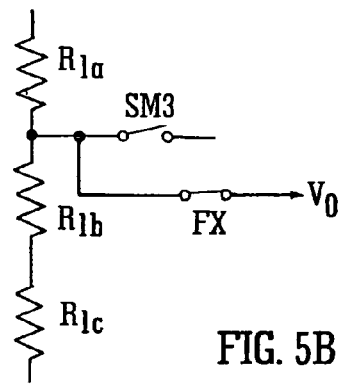

FIG. 5(b) introduces the new unloaded state where both terminals of the second resistor string, or LSB DAC, are disconnected in an unloaded state. No load is presented by the LSB DAC in the unloaded state and the MSB to LSB DAC current path is substantially open-circuited. There are a number of options open in the unloaded state. The LSB DAC reference terminals in this state can be coupled to known voltage potentials and/or the LSB DAC terminals can go to a high impedance. The decoding of the signals driving the switches coupling nodes from the first resistor string to the second resistor string is different and key to the operation of the present invention. The decoding for the control signal of the DAC can be amalgamated with the break-before-make logic design normally required during logic state conditions to reduce the control signal circuitry. This minimises the number of components and logic complexity within the converter. The unloaded state is considered to be a DC state, wherein the LSB DAC substantially does not load the MSB DAC.

Figure 5C:
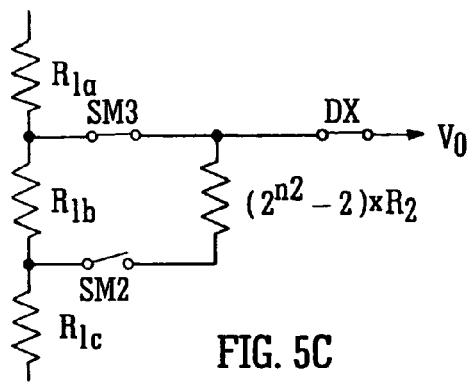
Figure 5D:
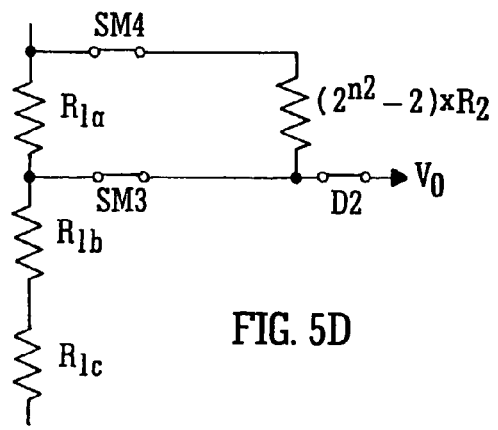

Referring to FIG. 5(c) illustrates another switching scheme implementing the present invention, where only one end terminal of the second resistor string, or LSB DAC, is disconnected in the substantially unloaded state. While the LSB DAC presents substantially no DC load to the MSB DAC in the unloaded state, a current path does exist between the MSB and LSB DAC, such that the voltage of the LSB DAC and output node is driven by the MSB DAC.

FIG. 6A shows a table illustrating a switching scheme used for an embodiment of the DAC providing an unloaded state using a first switching scheme as shown in FIG. 5B. For all input codes corresponding to the MSB DAC voltages, the F switches are used to couple the MSB DAC voltages to the output. For an LSB DAC with $N_2$ bits, there will be F switches are located at each MSB DAC terminal and the corresponding switch is enabled at zero code and every $N*2^{N2}$ codes.

When a voltage is required which corresponds to a voltage between two MSB DAC terminals, then the MSB & LSB DAC are used in combination to firstly, couple the LSB DAC across the relevant MSB resistor, and secondly to couple the output node $V_O$ to the correct LSB DAC terminal. "Leapfrog" switching, which is a known prior art switching technique, of the SM switches can be executed wherein one and only one SM switch is used per MSB DAC node to couple the LSB DAC to the MSB DAC.

FIG. 6B shows another table illustrating a second switching scheme for the embodiment shown in FIG. 5C. FIG. 6B is the same as FIG. 6A except at the MSB DAC unloaded nodes, where for the DAC described in FIG. 5C, the MSB DAC node required is coupled to the output node $V_O$ via enabling only the corresponding SM and at least one switch of the LSB DAC switches and is denoted Dx in FIG. 6B.

Figure 7A:
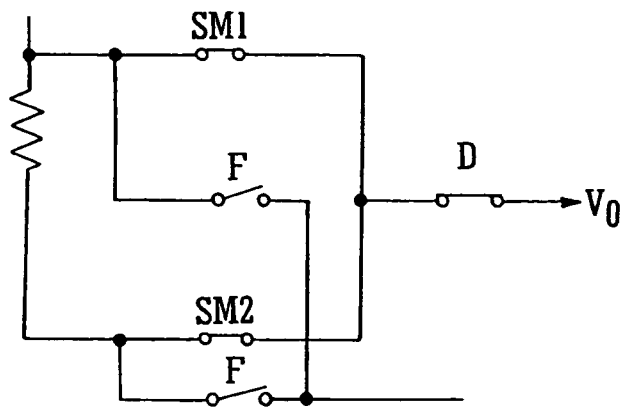
FIG. 7A and FIG. 7B illustrates two different circuit configurations for a single resistor and a number of resistors according to the invention.
Figure 7B:
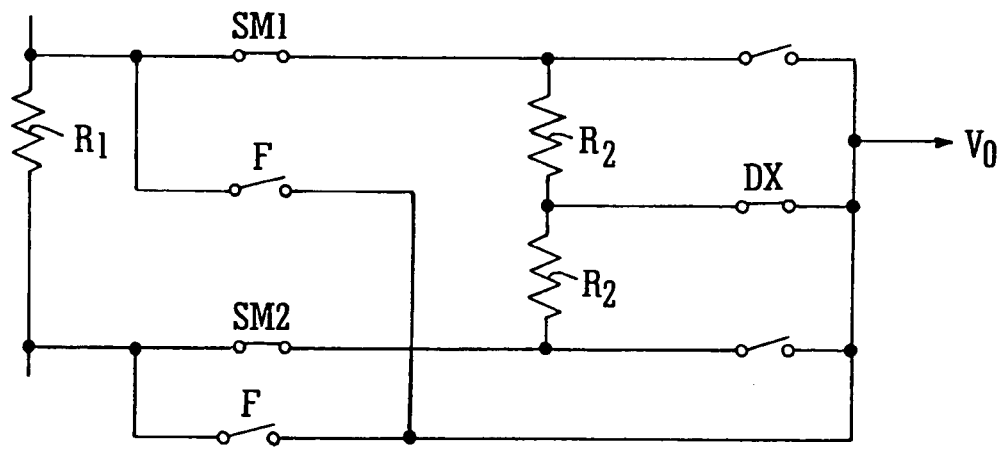

FIGS. 7A and 7B shows two different cases where N2=1 and N2=2. FIG. 7A shows an embodiment of the DAC with N2=1 and one impedance resistor string using the first switching scheme according to the present invention. The switching network is adapted to couple a voltage produced across a selected one of resistors in the resistor string to an output node in response to a digital input signal to produce a corresponding analog signal to said digital input signal at the out put node, wherein the unloaded state is provided for coupling the voltage to the output node Vo. $N_2=1$ is a special case requiring no LSB DAC resistors.

FIG. 7B shows the second case of the DAC with $N_2=2$ or more and two impedance resistor strings using the first switching scheme of the present invention. The first one of the resistor strings is adapted for coupling across a voltage supply. The resistors in the first resistor string produce voltages in response to a current feed from a voltage supply (not shown) in combination with the second one resistor strings. The switching network is adapted to couple a voltage produced across a selected one of resistors in the first string across the second one of the resistor strings in response to a digital input signal, the resistors in the second resistor string producing voltages in response to current passing through the first resistor string to the second resistor string through the switching network to produce a corresponding analog signal to said digital input signal to an output. This is achieved by generating an unloaded state when the LSB, associated with said first resistor string, is de-coupled from the MSB, associated with said second resistor string, of the digital input signal by the switching network. Using the formula given on FIG. 5(C), the number of LSB DAC resistors equals $2^2-2$ resulting in two LSB DAC resistors.

Figure 8A:
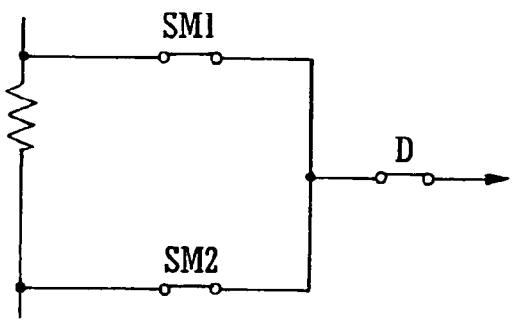
FIG. 8A, FIG. 8B and FIG. 8C are schematics illustrating an alternative embodiment of the invention.
Figure 8B:
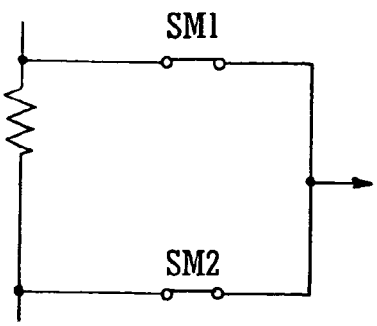
Figure 8C:
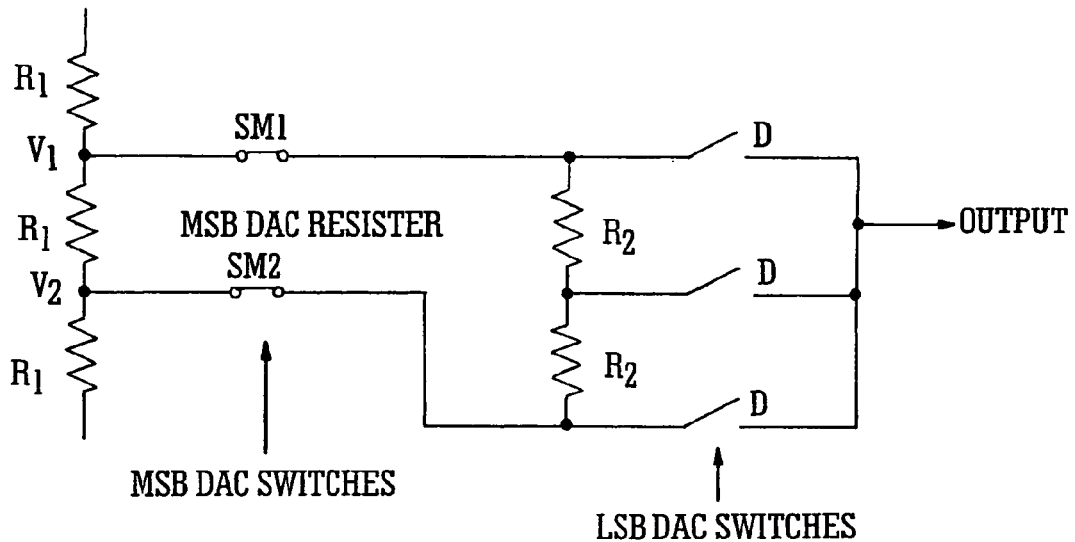

FIGS. 8A, 8B and 8C illustrates an alternative embodiment of the present invention which provides for an alternative coupling mechanism for the unloaded state where the MSB DAC node is coupled via enabling only the SM switch corresponding to the MSB DAC node required in combination with enabling at least one D switch of the LSB DAC switches to the output node $V_O$. It will be appreciated that one or more of the D switches need to be closed on the output to enable coupling of the voltage to the load. All that is required is that at least one D switch is closed to enable correct operation. FIG. 8A shows an embodiment with $N_2=1$, which is a special case and requires no LSB DAC resistors with a closed switch at the output node. Alternatively no switch at the output node may be required as shown in FIG. 8B. FIG. 8C shows an embodiment with $N_2=2$. Using the formula given on FIG. 5(C), the number of LSB DAC resistors equals $2^2-2$ resulting in two LSB DAC resistors.

Optimisation of the converter can be achieved, for example parasitic impedance can be integrated into the optimization and the switch circuit may include a series resistance element of the same type of resistor or resistance material as R1 and/or R2, parasitic impedances. Any further developments or inventions in terms of the controlled impedance switch design can be used here also.

It will be appreciated that the invention describes MOS switches for the operation of the invention. However it will be understood that the operation of the invention is not limited to MOS switches and can be employed using Junction Field Effect Transistors (JFET) switches, MEtal Semiconductor FET (MESFET) or High Electron Mobility Transistors (HEMT) or any other switching scheme used in converters.

Other embodiments are within the spirit and scope of the appended claims. For example, due to manufacturing variances and second order non-ideal conditions, the nominal values of R'1, R'2, and R'ON may be adjusted to give optimum results. Monte Carlo analysis, other statistical analysis or analog design optimization tools and methodologies may be used to perform this optimization. Further, various technologies may be used for the switches, such as CMOS transmission gates, one MOS transistor type (e.g., NMOS or PMOS), either of the above with a single, or plurality of, series resistors on one or both sides of the switch. Still further, two parallel resistor strings may be used.

The words "comprises/comprising" and the words "having/including" when used herein with reference to the present invention are used to specify the presence of stated features, integers, steps or components but does not preclude the presence or addition of one or more other features, integers, steps, components or groups thereof.

The invention is not limited to the embodiments hereinbefore described but may be varied in both construction and detail.

The invention claimed is:

1. A digital to analog converter (DAC), comprising:
   a pair of resistor strings, a first one of the resistor strings being adapted for coupling across a voltage supply, resistors in the first resistor string producing voltages in response to current fed thereto from the voltage supply and a second one of the resistor strings;
   a switching network adapted to couple a voltage produced across a selected one of resistors in the first string across the second one of the resistor strings in response to a digital input signal, said digital input signal comprising a digital bit stream, the resistors in the second resistor string producing voltages in response to current passing from the first resistor string through the second resistor string through said switching network to produce a corresponding analog signal to said digital input signal to an output; and
   wherein the switching network is adapted to provide an unloaded state generated when a Least Significant Bit (LSB) resistor of said DAC, associated with said first resistor string, is de-coupled from a Most Significant Bit (MSB) resistor of said DAC, associated with said second resistor string, of said digital input signal by said switching network.

2. The digital to analog to converter recited in claim 1 wherein the switching network is responsive to the most significant bits (MSB) of said digital input signal coupled to said first resistor string and the least significant bits (LSB) of said digital signal are coupled with said second resistor string.

3. The digital to analog converter recited in claim 1 wherein a node between
   neighboring resistors of said first resistor string is coupled to said output.

4. The digital to analog converter recited in claim 1 wherein the switches of the switching network associated with said first resistor string are sized such that the two states on either side of the unloaded state correspond to an LSB step at the output node.

5. The digital to analog converter recited in claim 1 wherein switches associated with said first resistor string couple a node from the first resistor string directly to said output node.

6. The digital to analog converter recited in claim 1 wherein a switch associated with said first resistor string is connected in series with a switch of said second resistor string to couple a load node of said first resistor string to said output node.

7. A digital to analog converter, comprising•
   a resistor string with a plurality of resistors;
   a switching network adapted to couple a voltage produced across a selected one of the resistors in said resistor string to an output node in response to a digital input signal, said digital signal comprising a digital bit stream, to produce a corresponding analog signal to said digital input signal at said output node, wherein the switching network is adapted to provide a substantially unloaded state for coupling the voltage to the output node.

8. The digital to analog to converter recited in claim 7 wherein the switching network is responsive to a most significant bit (MSB) resistor of said digital input signal coupled to said resistor string and a least significant bit (LSB) resistor of said digital signal is coupled to said output node.

9. The digital to analog converter recited in claim 7 wherein a node between neighboring resistors of said resistor string is coupled to said output node.

10. The digital to analog converter recited in claim 7 wherein the switches of the switching network associated with said first resistor string are sized such that the two states on either side of the unloaded state correspond to an LSB step at the output.

11. The digital to analog converter recited in claim 7 wherein switches associated with said resistor string couples a load node directly to said output during said unloaded state.

12. The digital to analog converter recited in claim 7 wherein a switch associated with said resistor string is connected to couple a load node of said resistor string to said output node.

13. A digital to analog converter, comprising:
a resistor string having a plurality of resistors;
  a switching element adapted to couple a voltage produced at a terminal of a selected resistor of said resistor string to an output node in response to a digital input signal, said signal comprising a digital bit stream to produce a corresponding analog signal to said digital input signal at said output node, wherein the switching network is adapted to provide an unloaded state for coupling the voltage to the output node at substantially no load condition.

14. The digital to analog converter recited in claim 13 wherein the switching network is responsive to a most significant bit (MSB) resistor of said digital input signal coupled to said resistor string and a least significant bit (LSB) resistor of said digital signal is coupled to said output node.

15. The digital to analog converter recited in claim 13 wherein a node between neighboring resistors of said resistor string is coupled to said output node.

16. The digital to analog converter recited in claim 13 wherein the switches of the switching network associated with said resistor string are sized such that the two states on either side of the unloaded state correspond to an LSB step at the output node.

17. The digital to analog converter recited in claim 13 wherein switches associated with said resistor string couples a load node directly to said output during said unloaded state.

18. The digital to analog converter recited in claim 13 wherein a switch associated with said resistor string is connected to couple a load node of said resistor string to said output node.

* * * * *